(12) United States Patent
Park

(10) Patent No.: US 8,885,783 B2
(45) Date of Patent: Nov. 11, 2014

(54) METHOD AND DEVICE FOR ITERATIVE BLIND WIDEBAND SAMPLING

(75) Inventor: Chester Park, San Jose, CA (US)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 0 days.

(21) Appl. No.: 13/430,973

(22) Filed: Mar. 27, 2012

(65) Prior Publication Data

US 2013/0028353 A1 Jan. 31, 2013

Related U.S. Application Data

(60) Provisional application No. 61/513,130, filed on Jul. 29, 2011.

(51) Int. Cl.
| | |
|---|---|
| H04L 7/00 | (2006.01) |
| H04L 27/00 | (2006.01) |
| H04W 16/14 | (2009.01) |
| H03M 7/30 | (2006.01) |
| H03M 1/18 | (2006.01) |
| H04B 1/00 | (2006.01) |
| H03M 1/12 | (2006.01) |

(52) U.S. Cl.
CPC ......... *H04L 27/0006* (2013.01); *H04W 16/14* (2013.01); *H03M 7/30* (2013.01); *H03M 7/3062* (2013.01); *H03M 1/18* (2013.01); *H04B 1/001* (2013.01); *H03M 1/124* (2013.01)
USPC ........................... 375/355; 330/306; 381/321

(58) Field of Classification Search
None
See application file for complete search history.

(56) References Cited

U.S. PATENT DOCUMENTS

| | | | |
|---|---|---|---|
| 6,195,537 B1 | 2/2001 | Allpress et al. | |
| 6,956,517 B1 * | 10/2005 | Baker et al. | 341/155 |

FOREIGN PATENT DOCUMENTS

| | | |
|---|---|---|
| WO | 2004/032348 A1 | 4/2004 |
| WO | 2005/017643 A2 | 2/2005 |
| WO | 2005/125016 A1 | 12/2005 |
| WO | 2013/017975 A1 | 2/2013 |

OTHER PUBLICATIONS

M. Mishali, et al., "From Theory to Practice: Sub-Nyquist Sampling of Sparse Wideband Analog Signals", IEEE J. of Selected Topics in Signal Processing, vol. 4, No. 2, Apr. 2010, pp. 375-391.
International Preliminary Report on Patentability and Written Opinion, issued in corresponding International Application No. PCT/IB2012/053617, dated Feb. 4, 2014, 7 pages.

* cited by examiner

*Primary Examiner* — Adolf Dsouza
(74) *Attorney, Agent, or Firm* — Rothwell, Figg, Ernst & Manbeck, P.C.

(57) ABSTRACT

Devices and methods for iteratively sampling a wideband signal in order to recover one or more narrowband signals are disclosed. In one aspect, a wideband signal is received and the signal is sampled using a sampling device, which includes an amplifier with an initial gain level, to produce a plurality of sampled signals. A first set of narrowband signals may be recovered from the plurality of sampled signals. Then, the wideband signal is re-sampled to produce a second plurality of sampled signals. The re-sampling includes increasing the gain of the amplifier to a second level and suppressing a component of the wideband signal. A second set of narrowband signals may then be recovered from the second set of sampled signals.

23 Claims, 15 Drawing Sheets

US 8,885,783 B2

METHOD AND DEVICE FOR ITERATIVE BLIND WIDEBAND SAMPLING

CROSS-REFERENCE TO RELATED APPLICATIONS

The present application claims priority benefit under 35 U.S.C. §119(e) of U.S. Provisional Patent Application No. 61/513,130, entitled "Iterative Wideband Sampling," filed Jul. 29, 2011, the contents of which are incorporated herein by reference in their entirety.

TECHNICAL FIELD

The present invention relates generally to recovering narrowband signals, and more particularly, to a method and device for blind sampling of a wideband signal in order to recover one or more narrowband signals.

BACKGROUND

Presently, the wireless spectrum is being used aggressively and dynamically by a great number of wireless systems, such as mobile telephone systems, wireless local and personal networks, wireless WAN, and WiMAX systems. Accordingly, the propagation-friendly frequency spectrum, ranging from a few kHz to several GHz, is either fully occupied by licensed systems (e.g., cellular networks) or overly interference-limited by unlicensed systems (e.g., Bluetooth). This has motivated recent research into robust spectrum sensing and dynamic spectrum use in the context of cognitive radios and software-defined radios. With continuing advances in CMOS technology, wideband sampling methods apply sophisticated digital signal processing techniques in order to improve the spectrum use. For instance, sub-Nyquist sampling is a technique which includes sampling a wideband signal with a sampling rate lower than Nyquist rate and processing it in digital domain. As described in M. Mishali and Y. C. Eldar, "From Theory to Practice: Sub-Nyquist Sampling of Sparse Wideband Analog Signals," IEEE J. of Selected Topics in Signal Proc., Vol. 4, pp. 375-391, April 2010 ("Mishali et al."), for example, a new paradigm of wideband sampling has been proposed, which is incorporated herein by reference in its entirety. Devices in accordance with this technique may sample a wideband signal in a blind manner, i.e., without a priori knowledge of the center frequencies of the narrowband signal that make up the wideband signal.

As described in Mishali et al., an analog wideband signal having unknown spectral support may be blindly sampled by first multiplying it by signals from a bank of periodic waveforms. The product is then low-pass filtered, amplified, and sampled by an analog-to-digital converter (ADC) at a low rate, which is orders of magnitude smaller than the Nyquist rate. Once the unknown spectral support of the wideband signal is identified, the continuous signals may be reconstructed using closed-form expressions based on the periodic waveforms that were used to sample the signal.

The blind wideband sampling technique discussed above does not assume any channel selection filtering before the ADCs sample each component; each component is processed with the same amplifier gain. Accordingly, a significant power variation among the narrowband signals comprising the wideband signal, for example, in the presence of strong interferers, such as adjacent-channel interferers or out-of-band interferers, may degrade the quality of recovered signals. For instance, a strong interferer may saturate one or more of the ADCs, and thus, the following digital signal processing (e.g., recovery) cannot operate properly.

This problem could be addressed by reducing the gain of the amplifiers; however, the noise of the ADC would become dominant compared to the desired signals. Because the known techniques assume that the wideband signal is formed of narrowband signals of comparable power, the signal cannot be sampled properly with conventional ADCs at a reasonably high signal-to-noise ratio (SNR).

Accordingly, there is a need for a method and device for blind wideband sampling that can correctly recover narrowband signals using conventional ADCs and achieve acceptable SNR values.

SUMMARY

Particular embodiments of the present invention are directed to devices and methods for iteratively sampling a wideband signal to recover one or more of the narrowband signals that form the wideband signal.

In one particular aspect, a method for iteratively sampling a wideband signal includes receiving a wideband signal and sampling the signal using a sampling device, which includes an amplifier with an initial gain level, to produce a plurality of sampled signals. The method further includes recovering a first set of narrowband signals from the plurality of sampled signals. Then, the wideband signal is re-sampled to produce a second plurality of sampled signals. The re-sampling includes increasing the gain of the amplifier to a second level and suppressing a component of the wideband signal. A second set of narrowband signals may be recovered from the second set of sampled signals.

In some embodiments, the method further includes determining if one or more of the recovered second narrowband signals satisfies a predetermined signal quality requirement. If not, the sampling and recovery steps may be repeated using different gain levels and/or suppression techniques.

According to particular embodiments of the present invention, the sampling device includes an amplifier, a low-pass filter, an ADC, and a mixer, which is configured to receive one or more mixing signals and mix the wideband signal with the mixing signal to produce a mixed signal. In these embodiments, the suppression of a component of the wideband signal may include adjusting the mixing signals based on one or more of the first plurality of recovered narrowband signals. Additionally, the suppression may include subtracting a narrowband suppression signal from the mixed signal, or directly from the wideband signal.

In some embodiments, the method includes using an up-conversion stage to up-convert a recovered narrowband signal to produce a suppression signal. The method further includes subtracting the suppression signal from the wideband signal. This subtraction may be accomplished prior to receipt of the wideband signal by the sampling device, or alternatively, within the sampling device.

Particular embodiments provide a device for iteratively sampling a signal. The device includes at least a conversion stage and a recovery stage. According to particular embodiments the present invention, the conversion stage includes an amplifier with a first gain level, and is configured to receive a wideband signal and sample the wideband signal to produce a plurality of sampled signals. Additionally, the recovery stage may be configured to receive the sampled signals and produce a first narrowband signal. The conversion stage may be further configured to re-sample the wideband signal using an increased gain while suppressing a component of the wideband signal. In certain aspects, the suppression is based on the narrowband signal produced by the recovery stage. By resampling, the conversion stage produces a second set of sampled signals that are used by the recovery stage to produce one or more second narrowband signals.

In some embodiments, the recovery stage is configured to determine whether at least one of the second narrowband signals satisfies a predetermined signal quality requirement. The device may be configured to re-sample and recover using another gain level, or additional suppression techniques, if the second narrowband signal does not satisfy the signal quality requirement. The device may be configured to repeat the sampling process with different gain levels and/or suppression techniques until a satisfactory signal quality is achieved. Satisfactory signal quality may be application dependent, based on one or more communications standards, or any metric determined to allow for successful digital signal processing in a later stage.

According to certain embodiments of the invention, the conversion stage may further include a low-pass filter, an ADC, and a mixer configured to receive one or more mixing signals and mix the wideband signal with the mixing signal to produce a mixed signal. In these embodiments, the device may be configured to suppress a component of the wideband signal by adjusting the mixing signals based on the first recovered narrowband signal. Additionally, the suppression may be achieved by subtracting a narrowband suppression signal from the mixed signal.

In some embodiments, the device further includes an up-conversion stage that is configured to up-convert the recovered narrowband signal to produce a suppression signal. The device may also be configured to subtract the suppression signal from the wideband signal. This may occur before the conversion stage, or alternatively, within the conversion stage.

The above and other aspects and embodiments are described below with reference to the accompanying drawings.

BRIEF DESCRIPTION OF THE DRAWINGS

The accompanying drawings, which are incorporated herein and form part of the specification, illustrate various embodiments of the present disclosure and, together with the description, further serve to explain the principles of the disclosure and to enable a person skilled in the pertinent art to make and use the embodiments disclosed herein. In the drawings, like reference numbers indicate identical or functionally similar elements.

DETAILED DESCRIPTION

In exemplary embodiments of the disclosed devices and methods, blind wideband sampling is improved by sampling the wideband signal with iteratively increased amplifier gains and one or more suppression techniques until a satisfactory narrowband signal is recovered.

Of particular interest is the situation where the narrowband signals that form the wideband signal have a significant variation in power level, which conventional ADCs cannot accommodate without severely degrading the SNR. The sampling and recovery iterations with varied levels of amplifier gain guarantee proper operation of the ADCs. Once a first set of one or more narrowband signals are recovered, it is possible to include/exclude them from the next iteration. For example, strong desired signals (or strong interferers) can be excluded, while weak desired signals can be included, and thus, sampled and recovered. The inclusion or exclusion of a certain narrowband signal with a known center frequency may be enabled, for example, through the use of appropriate mixing signals in conjunction with one or more suppression techniques.

Figure 1:
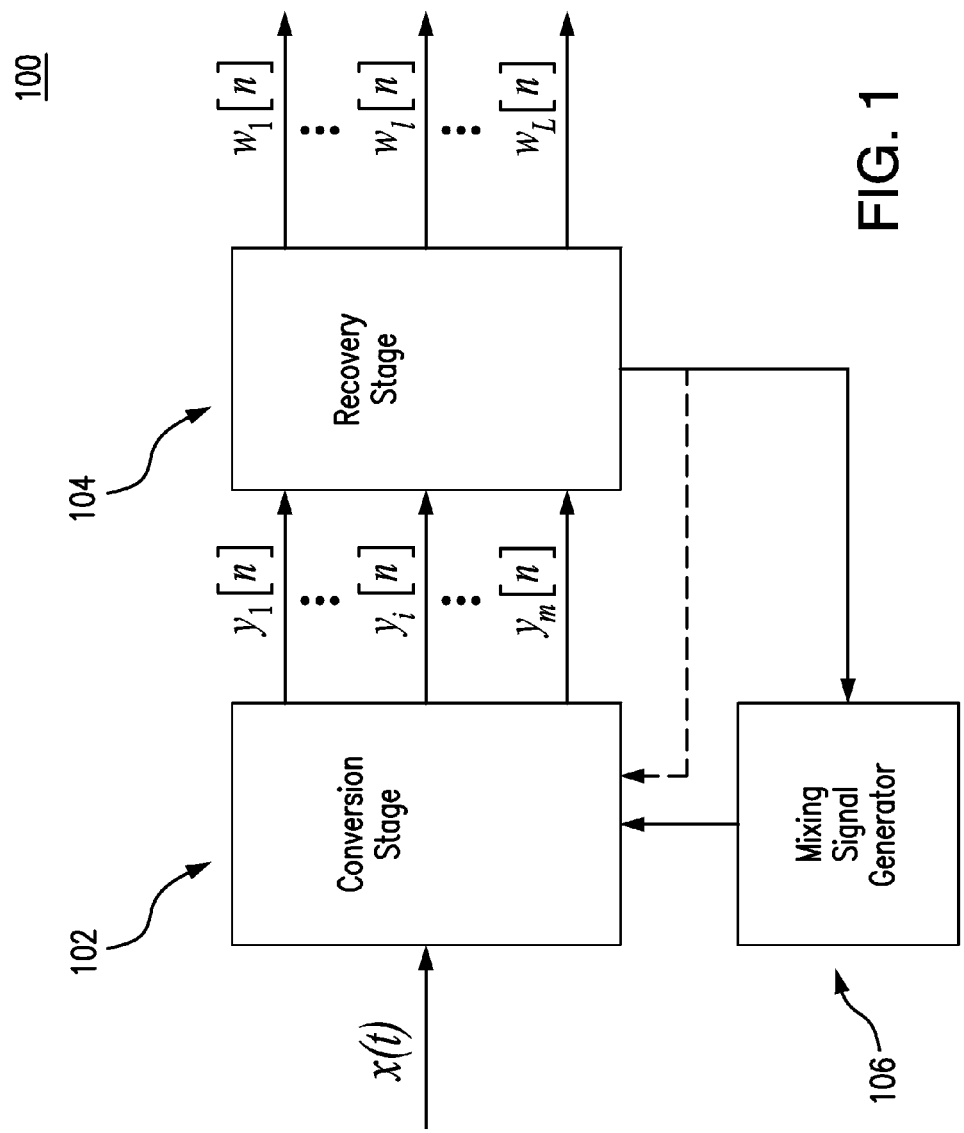
FIG. 1 is a block diagram of a device for iteratively sampling a wideband signal in accordance with exemplary embodiments of the present invention.

FIG. 1 is a block diagram of a device for iteratively sampling a wideband signal in accordance with exemplary embodiments of the present invention, where the wideband signal is a combination of multiple narrowband components. The wideband signal x(t) is received at conversion stage 102 of an iterative sampling device 100. The conversion stage 102 may be, for example, a modulated wideband converter that includes multiple channels of mixers, low-pass filters, amplifiers, and ADCs. Using mixing signals $p_m(t)$, which may be received from mixing signal generator 106, the conversion stage 102 samples the wideband signal to produce a plurality of sampled signals $y_m[n]$. These sampled signals are subsequently received by a recovery stage 104, which is configured to output a set of recovered narrowband signals $w_L[n]$.

According to certain embodiments of the present invention, the narrowband signals may be recovered using closed form expressions and information about the mixing signals $p_m(t)$. The recovery stage 104 may be further configured to provide control to the mixing signal generator, and optionally, to control the conversion stage. Alternatively, the conversion stage and mixing signal generator could be controlled by an independent control unit (not shown).

Figure 2:
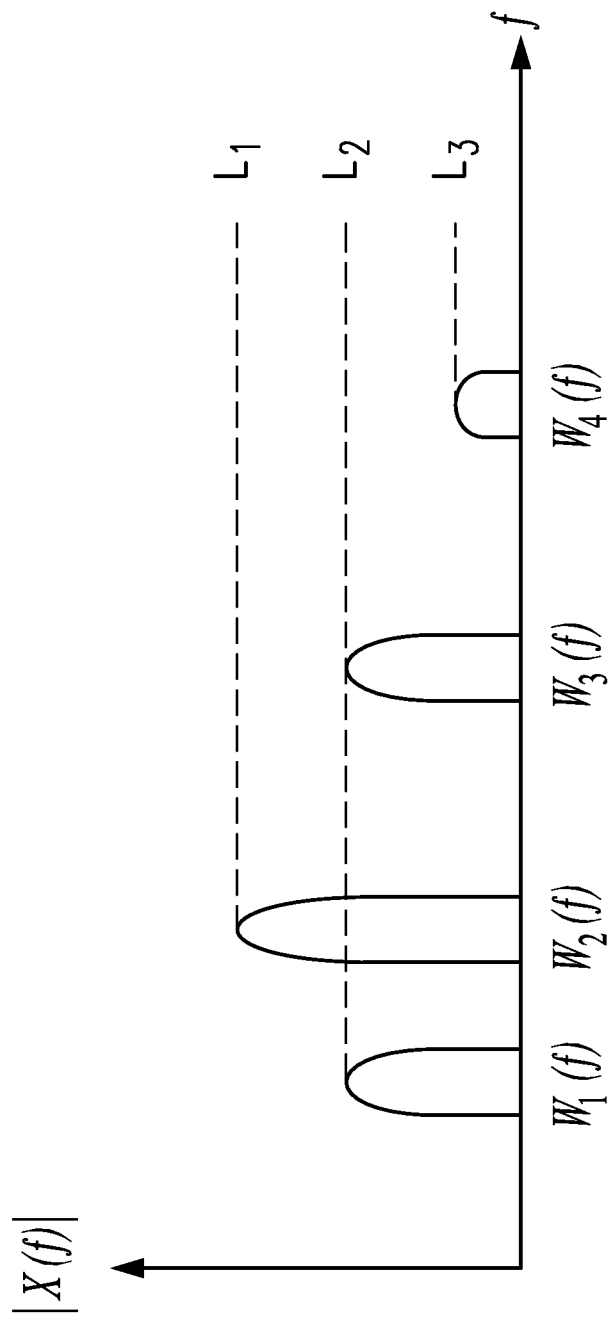
FIG. 2 is an illustration of the Fourier transform of a wideband signal comprised of multiple narrowband signals.

The wideband signal x(t) may be formed from several narrowband signals. For instance, x(t) may consist of four narrowband signals, $w_1(t)$, $w_2(t)$, $w_3(t)$, and $w_4(t)$. FIG. 2 is a plot of the amplitude of the Fourier transform of x(t), |X(f)|, which shows the power of each of the sub-components of x(t). Each sub-component has a power level $L_1$, $L_2$, or $L_3$. The differences between the power levels of the subcomponents could be as much as 50 dB in certain applications. For example, the power level of $L_3$ could be near the noise floor of a typical ADC, approximately −100 dBm, while the power level of $L_1$ could be approximately −50 dBm. In the present example, and as shown in FIG. 2, $w_2(t)$ has the highest power, $L_1$, while $w_4(t)$ has the lowest power, $L_3$. Each of $w_1(t)$ and $w_3(t)$ has an intermediate power level, $L_2$, which could be, for example, approximately −75 dBm. According to certain embodiments of the present invention, the power variation between $L_1$, $L_2$, and $L_3$ may be beyond the dynamic range of the ADCs. For instance, certain types of ADCs may have a dynamic range of only 20-40 dB.

According to certain embodiments of the present invention, the use of different mixing signals and amplifier gains can avoid the saturation of the ADCs, while guaranteeing sufficiently high SNRs. An exemplary method includes changing the amplifier gain (i.e., increasing the gain) and adjusting the mixing signals until one or more of the ADCs is out of saturation. In another example, a suppression signal can be subtracted from the wideband signal to prevent a component having a high power from driving one or more of the ADCs into saturation. This suppression signal could be, for example, the baseband equivalent of one of the previously recovered narrowband signals or generated based on the recovered narrowband signal using a periodic signal. The suppression signal could be subtracted from an intermediate signal within the conversion stage, or, alternatively, a suppression signal generated by up-converting a recovered signal can be subtracted from the wideband signal x(t) before the conversion stage. In each of the examples described above, the amplifier gain could be increased to improve SNR without saturating the ADCs because the higher power components are sufficiently suppressed.

In some embodiments, different iterations may create multiple replicas of the same narrowband signals. Each of these different replicas may experience different levels of interference and noise. In particular, each replica may experience different levels of ADC noise corresponding to the different levels of the amplifier gain. A set of these different replicas may be combined to form a composite signal. They may be combined using different combining weights, which may depend on the corresponding interference and noise levels. For instance, more accurate replicas may have a higher combining weight, and thus, contribute more to the composite signal.

Figure 3:
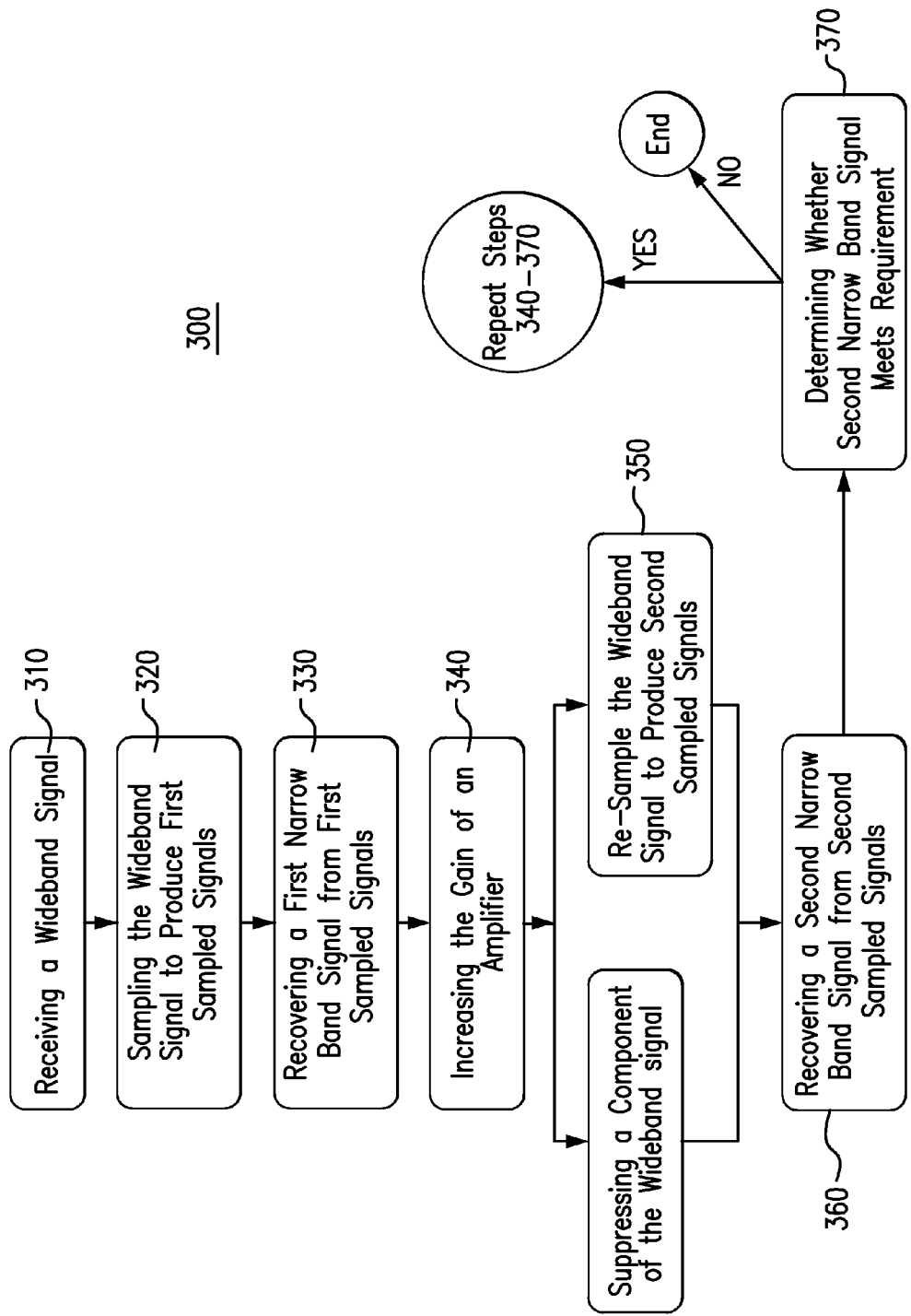
FIG. 3 is a flow chart illustrating a process for iteratively sampling a signal in accordance with exemplary embodiments of the present invention.

Referring to FIG. 3, a flow chart 300 is provided, which illustrates a process for iteratively sampling a wideband signal x(t) while suppressing a narrowband component of the wideband signal, in accordance with exemplary embodiments of the disclosed devices and methods.

In the first step of the process 310, a wideband signal x(t) is received at a conversion stage 102. The signal may be received, for example, from a base station in a wireless communication network, such as a multi-band cognitive radio.

Figure 14:
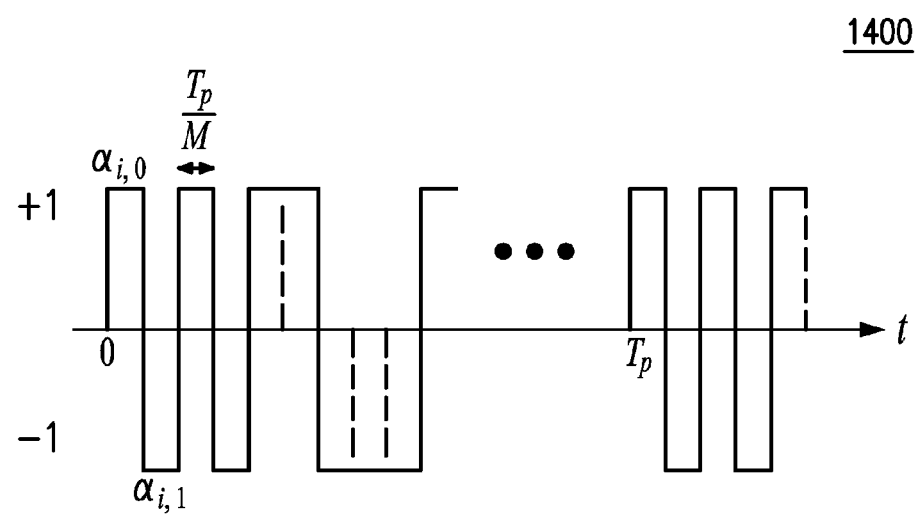
FIG. 14 is an illustration of a mixing signal in accordance with exemplary embodiments of the present invention.

In step 320, the wideband signal is sampled by the conversion stage 102 to produce sampled signals $y_m[n]$ using a mixing signal $p_m(t)$ from the mixing signal generator 106. The conversion stage is configured with an initial gain level for one or more of the amplifiers within the conversion stage 102. According to certain embodiments of the present invention, the mixing signal $p_m(t)$ 1400 may be chosen as a piecewise constant function that alternates between the levels of +/−1 over M equal time intervals as shown in FIG. 14. The mixing signal may be defined as:

$$p_i(t)=\alpha_{ik}, k(T_p/M) \le t \le (k+1)(T_p/M), 0 \le k \le M-1,$$

with $\alpha_{ik} \in \{+1, -1\}$, and $p_i(t+nT_p)=p_i(t)$ for every $n \in Z$. Other definitions of the mixing signal are possible, provided that $p_m(t)$ is periodic. In some embodiments, the mixing signal may be determined by the recovery stage 104. Alternatively, the mixing signal may be determined by an independent control unit.

In step 330, the recovery stage recovers a first set of narrowband signals $w_L[n]$ using the sampled signals $y_m[n]$ that were produced by the conversion stage. The recovery of one or more narrowband signals may include, for example, determining the location of strong narrowband signals in the frequency band. Once the frequency support of the received wideband signal is available, digital signal processing may be performed on the sampled signals $y_m[n]$ to produce the recovered narrowband signals $w_L[n]$.

In step 340, the gain of one or more of the amplifiers within the conversion stage is increased to a second gain level. In some embodiments, the gain level may be determined by the recovery stage 104. Alternatively, the gain level may be controlled by an independent control unit.

In step 350, the wideband signal is re-sampled by the conversion stage 102 in order to produce a second set of sample signals. During this step, the wideband signal is sampled using the higher gain level, while a component of the wideband signal is suppressed. For instance, the component of the wideband signal which has the highest power level may be suppressed in order to sample lower-powered signals. This iteration uses a higher gain setting without driving any of the ADCs within the conversion stage into saturation.

In step 360, the recovery stage 104 recovers a second set of narrowband signals from the second set of sampled signals produced by the conversion stage 102 during re-sampling. At step 370, the device determines whether one or more of the recovered narrowband signals has adequate signal properties to be used in subsequent processing. The recovered signal may be evaluated based on one or more predetermined signal quality thresholds, such as signal-to-noise ratio. The determination of acceptable signal quality thresholds could be application specific. For instance, with respect to SNR, acceptable values would depend on parameters such as the applied modulation and coding schemes. For instance, higher quality recovery may be required in a system applying a 64 QAM modulation scheme with a ¾ coding rate, such as a 20 dB SNR requirement. Conversely, the requirements may be reduced in a system applying a Quadrature Phase Shift Keying (QPSK) scheme with a ⅓ coding rate, such as a 0 dB SNR requirement. Even higher quality metrics may be required in a multiple stream application, for instance, a 30 dB SNR value. If it is determined that none of the recovered signals has satisfactory properties, steps 340-370 may be repeated.

Figure 4A:
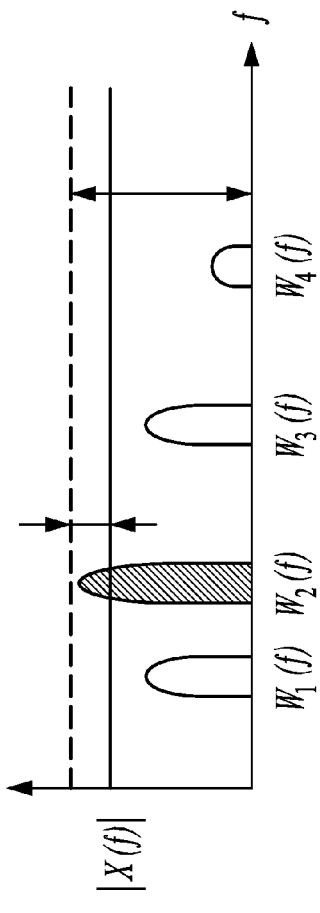
FIG. 4 illustrates multiple iterations of a modified signal in accordance with exemplary embodiments of the present invention.
Figure 4B:
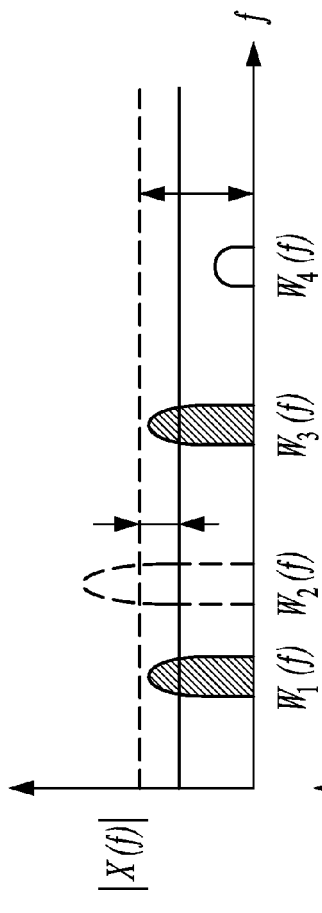
Figure 4C:
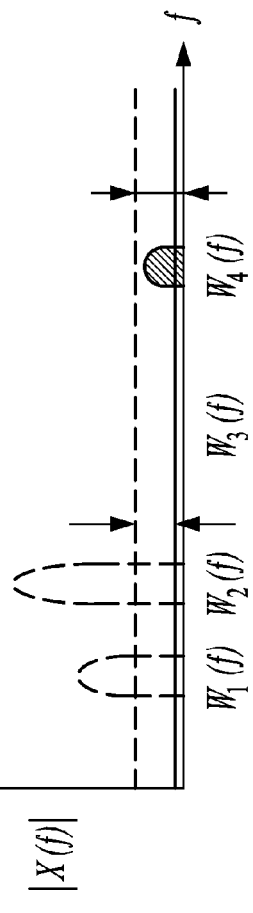

With reference to FIG. 4, a) illustrates an exemplary amplifier setting for recovery of a component of the wideband signal x(t), narrowband signal $w_2(t)$. In this example, the wideband signal consists of four narrowband signals, $w_1(t)$, $w_2(t)$, $w_3(t)$, and $w_4(t)$. However, the methods and devices discussed herein are applicable to any wideband signal comprising more than one narrowband signal. As is shown in iteration a) illustrated in FIG. 4, each of the four narrowband signals are within the full scale range of the ADCs (as shown by the dashed line), and thus, the ADC can operate properly without saturation, without the need for suppression. Additionally, in this iteration, the narrowband signal of interest, $w_2(t)$, can be recovered correctly, since it is has a signal power level that is greater than the ADC noise floor (as shown by the solid line). However, due to the limited dynamic range of conventional ADCs, each of the remaining narrowband signals has a signal power level below the ADC noise floor. It would therefore be difficult to recover these remaining signal components correctly. Thus, in order for $w_1(t)$, $w_3(t)$, or $w_4(t)$ to be properly recovered, the gain level of the amplifiers in the conversion stage 102 need to be iterated to higher amplifier gain levels so that the ADC noise is below the desired signal level; this is accomplished while suppressing $w_2(t)$ to prevent saturation.

Referring to b) in FIG. 4, an exemplary second iteration for sampling x(t) is illustrated. By increasing the amplifier gain, the signal strength of components $w_1(t)$ and $w_3(t)$ can be elevated above the noise level of the ADC. Therefore, it is possible to recover these signals correctly. In order to avoid saturating the ADC due to the higher amplifier gain, all the signals beyond the dynamic range, in this example, $w_2(t)$, are subtracted, or, at least, suppressed down to the full scale range of the ADCs.

Referring to c) in FIG. 4, an exemplary third iteration for sampling x(t) is illustrated. In order to recover $w_4(t)$ correctly, it is necessary to increase the amplifier gain further so that the ADC noise level is below the signal level of component $w_4(t)$. As in previous iterations, all the other signals that exceed the full-scale range of the ADCs are subtracted or suppressed to avoid saturating the ADCs.

The subtraction (i.e., complete removal) or suppression (i.e., reduction) of a narrowband signal component of the wideband signal is possible once it has been recovered in a previous iteration. Once a narrowband signal is recovered, both the baseband equivalent signal and the center frequency become available. Sampling iterations may be accomplished using any suppression technique or combination of suppression techniques, examples of which are provided below.

Figure 5:
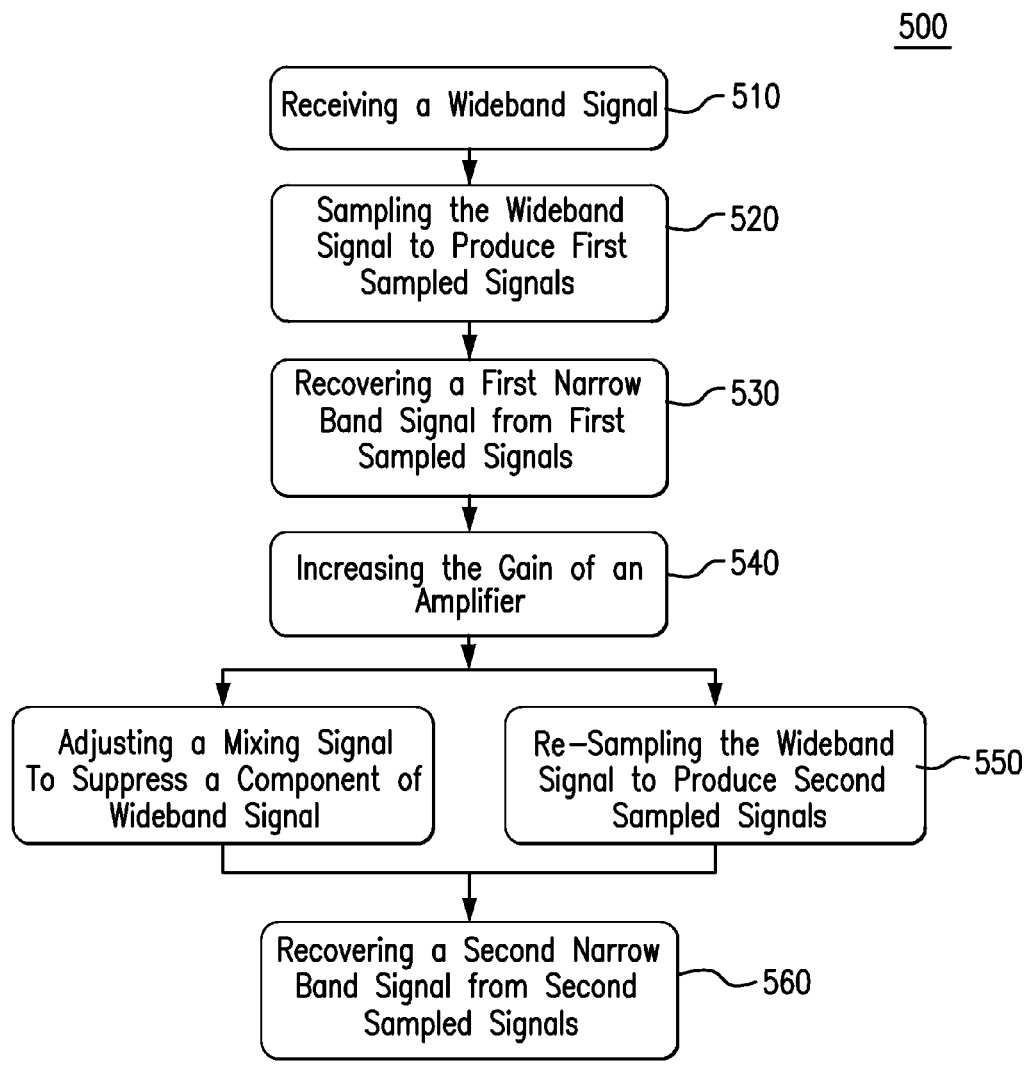
FIG. 5 is a flow chart illustrating a process for iteratively sampling a signal in accordance with exemplary embodiments of the present invention.

Referring to FIG. 5, a flow chart 500 is provided that illustrates a process for iteratively sampling a wideband signal, including suppressing a narrowband component of the wideband signal by adjusting a mixing signal, in accordance with exemplary embodiments of the disclosed devices and methods.

In the first step of the process 510, a wideband signal x(t) is received at a conversion stage 102. The signal may be received, for example, from a base station in a wireless communication network, such as a multi-band cognitive radio.

In step 520, the wideband signal is sampled by the conversion stage 102 to produce sampled signals $y_m[n]$ using a first set of mixing signals $p_m(t)$ received from mixing signal generator 106 and an initial gain level for one or more of the amplifiers within the conversion stage 102. In step 530, the recovery stage recovers a first set of narrowband signals $w_L[n]$ using the sampled signals $y_m[n]$, which were produced by the conversion stage.

In step 540, the gain of one or more of the amplifiers within the conversion stage is increased to a second gain level. In step 550, the wideband signal is re-sampled by the conversion stage 102 in order to produce a second set of sampled signals. During this step, the wideband signal is sampled using the higher gain level, while a component of the wideband signal is suppressed.

Figure 6:
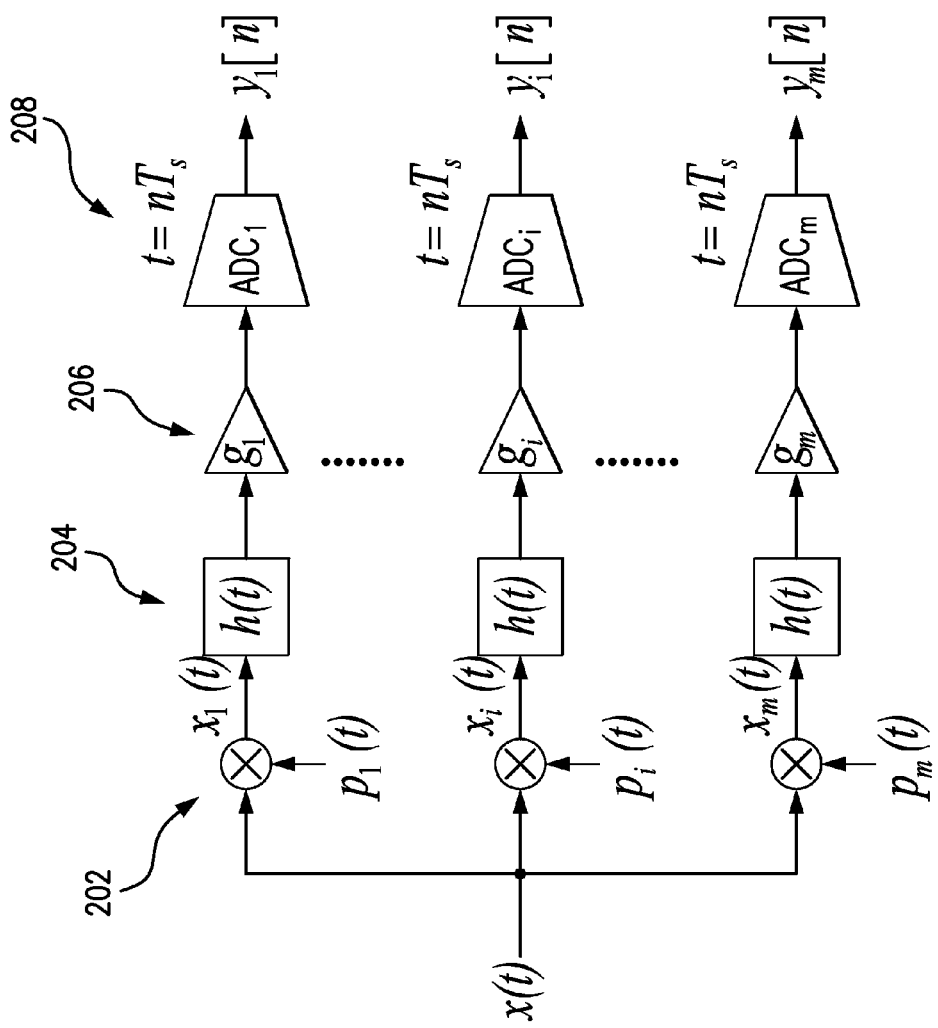
FIG. 6 is a schematic of a conversion circuit in accordance with exemplary embodiments of the present invention.

Suppression, or even complete subtraction, may be accomplished by adjusting the mixing signals $p_m(t)$ utilized by the conversion stage 102. According to particular embodiments of the present invention, the conversion stage 102 may comprise a modulated wideband converter, such as the device shown in FIG. 6. For instance, the conversion stage 102 may comprise a plurality of channels that contain a mixer 202, a low-pass filter 204, an amplifier 206, and an ADC 208. As shown in FIG. 6, due to the mixer 202, the input to ADC 208 within each channel is a linear combination of frequency-shifted copies, whose combining weights depend on each mixing signal $p_i(t)$. Thus, it is possible to subtract or suppress a specific narrowband signal by choosing a mixing signal whose combining weight corresponding to the narrowband signal to be suppressed is sufficiently small. In certain embodiments, the mixing signals should be selected such that each of the ADCs 208 is out of saturation.

In step 560, the recovery stage 104 recovers a second set of narrowband signals from the second set of sampled signals produced by the conversion stage 102 during re-sampling.

Figure 7:
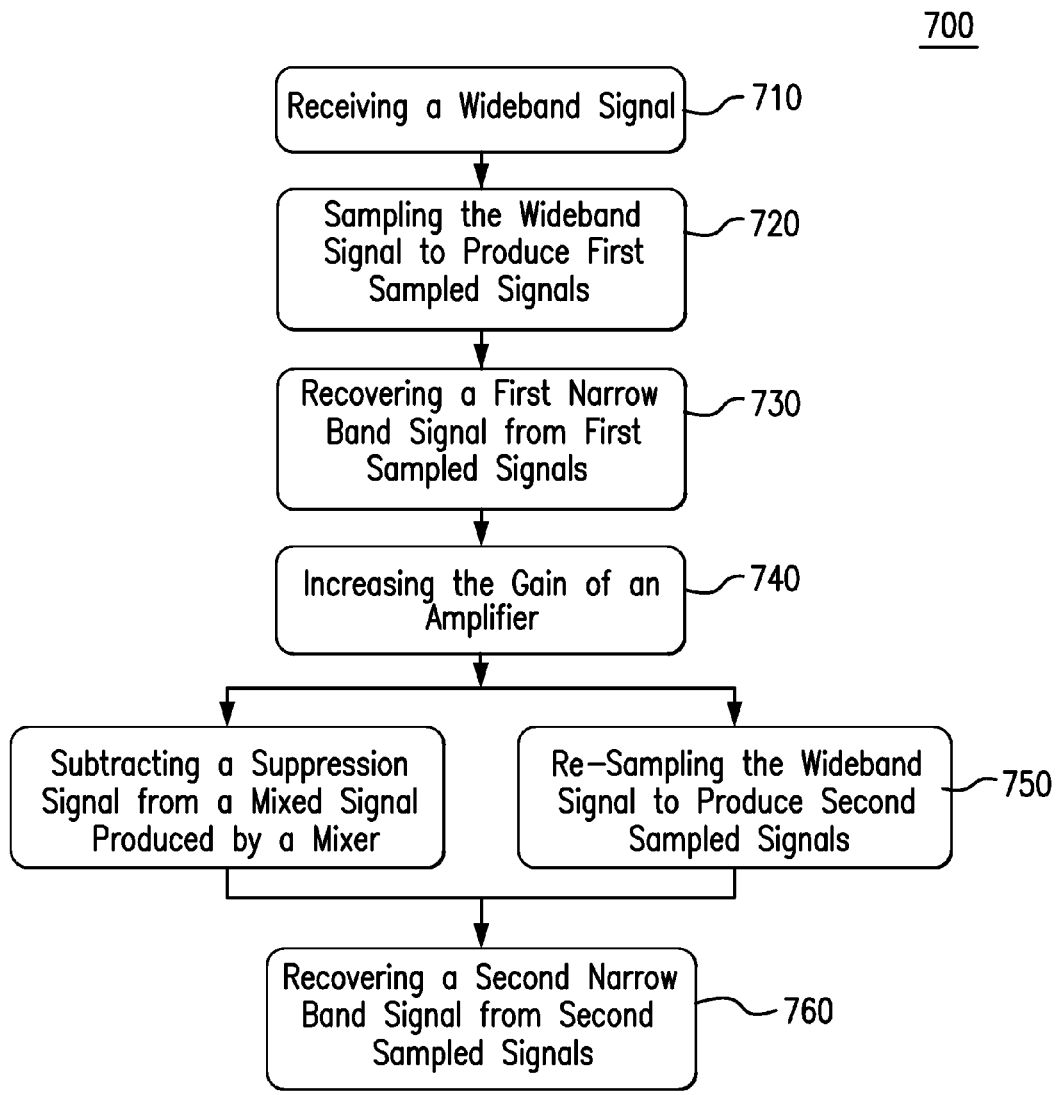
FIG. 7 is a flow chart illustrating a process for iteratively sampling a signal in accordance with exemplary embodiments of the present invention.

Referring to FIG. 7, a flow chart 700 is provided that illustrates a process for iteratively sampling a wideband signal, including suppressing a narrowband component of the wideband signal by subtracting a suppression signal from an intermediate mixed signal within a channel of the conversion stage 102, in accordance with exemplary embodiments of the discloses devices and methods.

In the first step of the process 710, a wideband signal x(t) is received at a conversion stage 102. The signal may be received, for example, from a base station in a wireless communication network, such as a multi-band cognitive radio.

In step 720, the wideband signal is sampled by the conversion stage 102 to produce sampled signals $y_m[n]$ using a first set of mixing signals $p_m(t)$ from mixing signal generator 106 and an initial gain level for one or more of the amplifiers within the conversion stage 102. In step 730, the recovery stage recovers a first set of narrowband signals $w_L[n]$ using the sampled signals $y_m[n]$, which were produced by the conversion stage.

In step 740, the gain of one or more of the amplifiers within the conversion stage is increased to a second gain level. In step 750, the wideband signal is re-sampled by the conversion stage 102 in order to produce a second set of sampled signals. During this step, the wideband signal is sampled using the higher gain level while a component of the wideband signal is suppressed.

Figure 8:
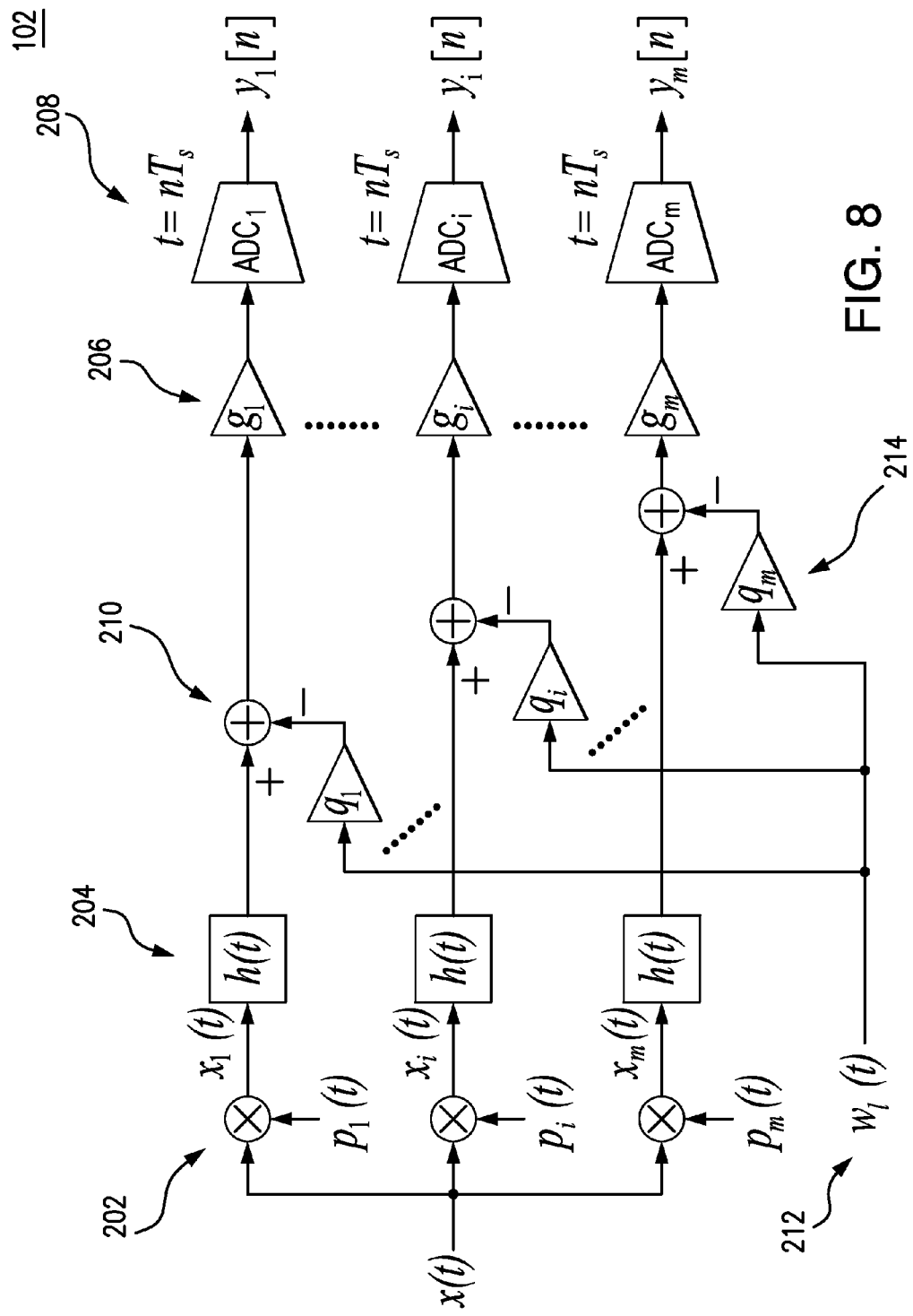
FIG. 8 is a schematic of a conversion circuit in accordance with exemplary embodiments of the present invention.

According to particular embodiments of the present invention, suppression is accomplished by subtracting a suppression signal from a mixed signal within the conversion stage 102. According to certain embodiments of the present invention, the conversion stage 102 may comprise a modulated wideband converter, such as the device shown in FIG. 8. For instance, the conversion stage 102 may comprise a plurality of channels that contain a mixer 202, a low-pass filter 204, a combining node 210, an amplifier 206, and an ADC 208. As illustrated in FIG. 8, a suppression signal may be subtracted from an intermediate mixed signal within a channel of the conversion stage 102. The suppression signal may be, for example, a baseband equivalent of the narrowband signal recovered during a previous iteration.

For instance, a suppression signal $w_i(t)$ may be received by a modulated wideband converter and fed to an inverting amplifier, such as suppression amplifier 214. The output of the suppression amplifier, having a gain q, is then combined with the intermediate mixed signal within the channel, effectively subtracting the narrowband signal from the signal of the channel. The gain q of the additional suppression amplifier 214 may be determined based on the combining weight for the narrowband signal being subtracted or suppressed. According to certain embodiments of the present invention, the suppression signal $w_i(t)$ may be received directly from the recovery stage. The suppression signal $w_i(t)$ may be an analog version of sampled signal $w_L[n]$ that has been converted using a digital-to-analog converter.

In step 760, the recovery stage 104 recovers a second set of narrowband signals from the second set of sampled signals produced by the conversion stage 102 during re-sampling.

Figure 9:
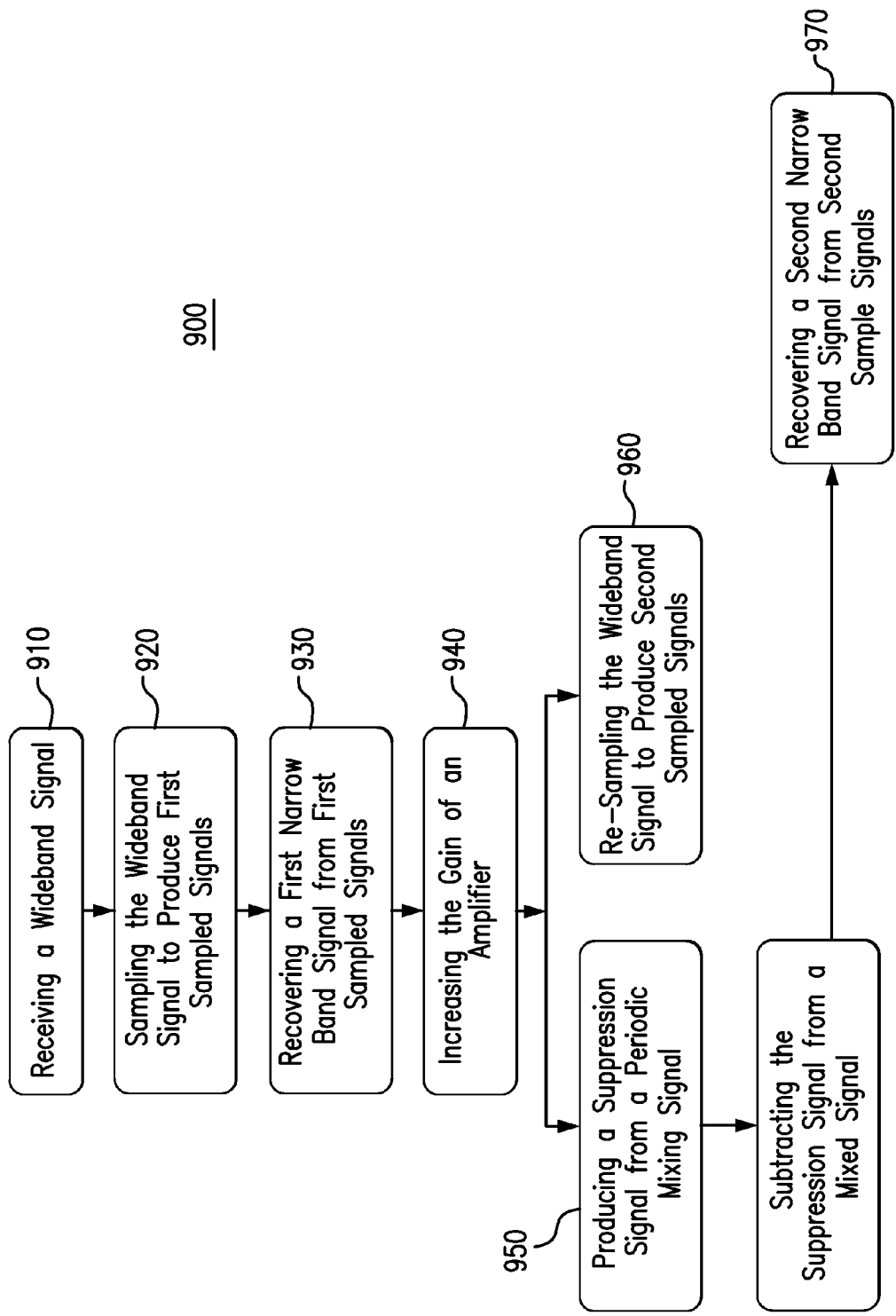
FIG. 9 is a flow chart illustrating a process for iteratively sampling a signal in accordance with exemplary embodiments of the present invention.

Referring to FIG. 9, a flow chart 900 is provided that illustrates a process for iteratively sampling a wideband signal, including suppressing a narrowband component of the wideband signal by subtracting a suppression signal from a mixed signal within the conversion stage 102, in accordance with exemplary embodiments of the disclosed devices and methods. In this example, the suppression signal is generated using a periodic mixing signal, such as a sinusoidal or square wave, having the frequency of the narrowband component to be suppressed.

In the first step of the process 910, a wideband signal x(t) is received at a conversion stage 102. The signal may be received, for example, from a base station in a wireless communication network, such as a multi-band cognitive radio.

In step 920, the wideband signal is sampled by the conversion stage 102 to produce sampled signals $y_m[n]$ using a first set of mixing signals $p_m(t)$ from mixing signal generator 106 and an initial gain level for one or more of the amplifiers within the conversion stage 102. In step 930, the recovery stage recovers a first set of narrowband signals $w_L[n]$ using the sampled signals $y_m[n]$ produced by the conversion stage.

In step 940, the gain of one or more of the amplifiers within the conversion stage is increased to a second gain level. In steps 960, the wideband signal is re-sampled by the conversion stage 102 in order to produce a second set of sampled signals. During this step, the wideband signal is sampled using the higher gain level while a component of the wideband signal is suppressed, as shown in step 950.

According to particular embodiments of the present invention, suppression is accomplished by subtracting a suppression signal from a mixed signal within the conversion stage 102. According to certain embodiments of the present invention, the conversion stage 102 may comprise a modulated wideband converter, such as the device shown in FIG. 10. For instance, the conversion stage 102 may comprise a plurality of channels that contain a mixer 202, a low-pass filter 204, a combining stage 210, an amplifier 206, and an ADC 208.

Figure 10:
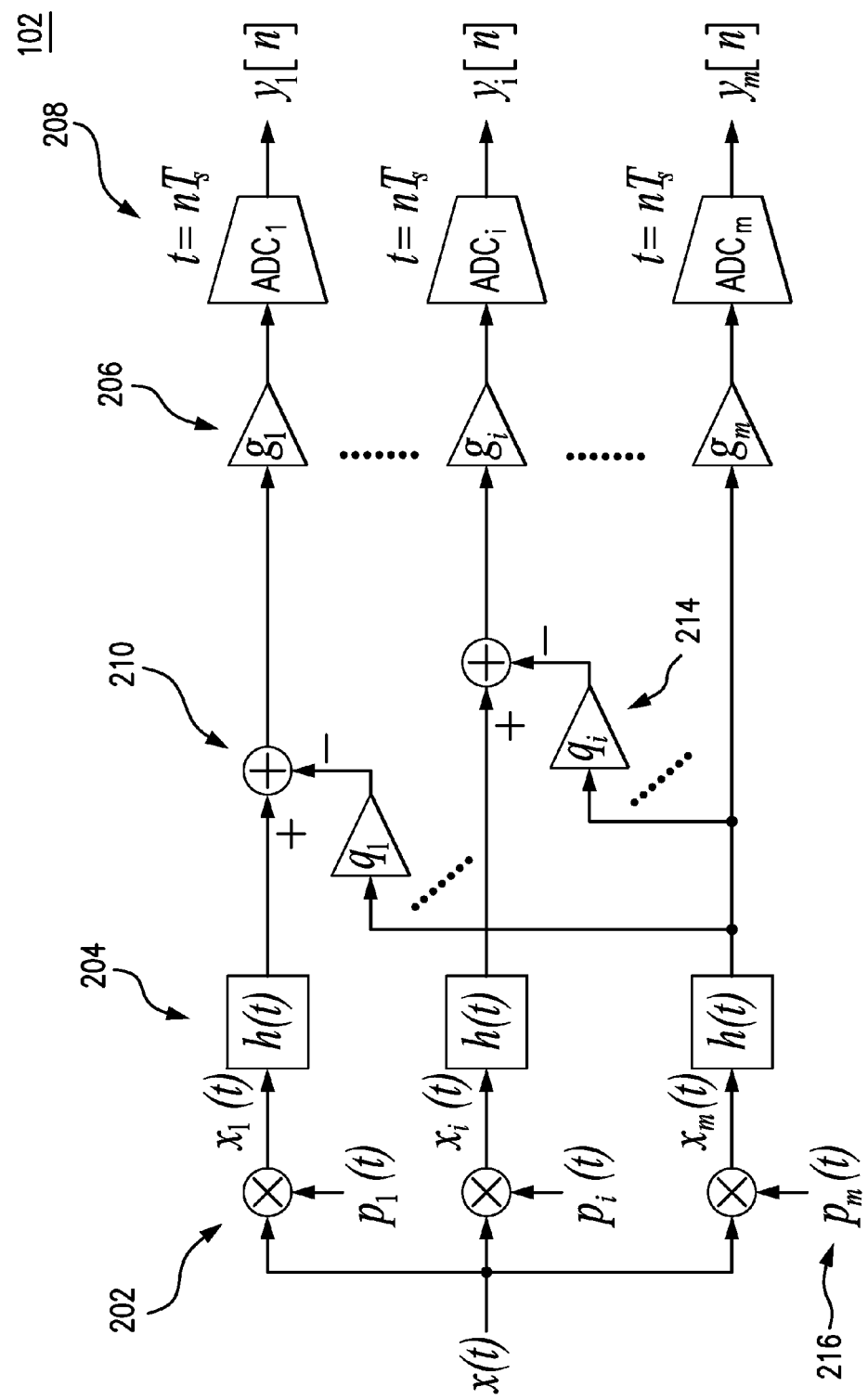
FIG. 10 is a schematic of a conversion circuit in accordance with exemplary embodiments of the present invention.

As shown in FIG. 10, and in comparison with the configuration depicted in FIG. 8, the subtraction or suppression of a narrowband signal within a conversion stage, such as an MWC, can be accomplished without feeding a suppression signal $w_i(t)$, such as a baseband equivalent of the recovered narrowband signal, into the conversion stage. Rather, it is possible to generate the baseband equivalent signal from within a channel of the conversion stage by adjusting a mixing signal $p_m(t)$ 216. According to particular embodiments of the present invention, the mixing signal $p_m(t)$ 216 is chosen such that the combining weights for all the other narrowband signals are sufficiently small. A periodic mixing signal for conventional down-conversion, e.g., a sinusoidal wave or a square wave, is an example of this type of mixing signal. In FIG. 10, the last channel within the conversion stage 102 is dedicated to the generation of the baseband equivalent signal to be subtracted or suppressed. As in certain other embodiments of the present invention, an additional amplifier 214 with gain q, determined based on the combining weight for the narrowband signal, is used.

In step 970, the recovery stage 104 recovers a second set of narrowband signals from the second set of sampled signals produced by the conversion stage 102 during re-sampling.

Figure 11:
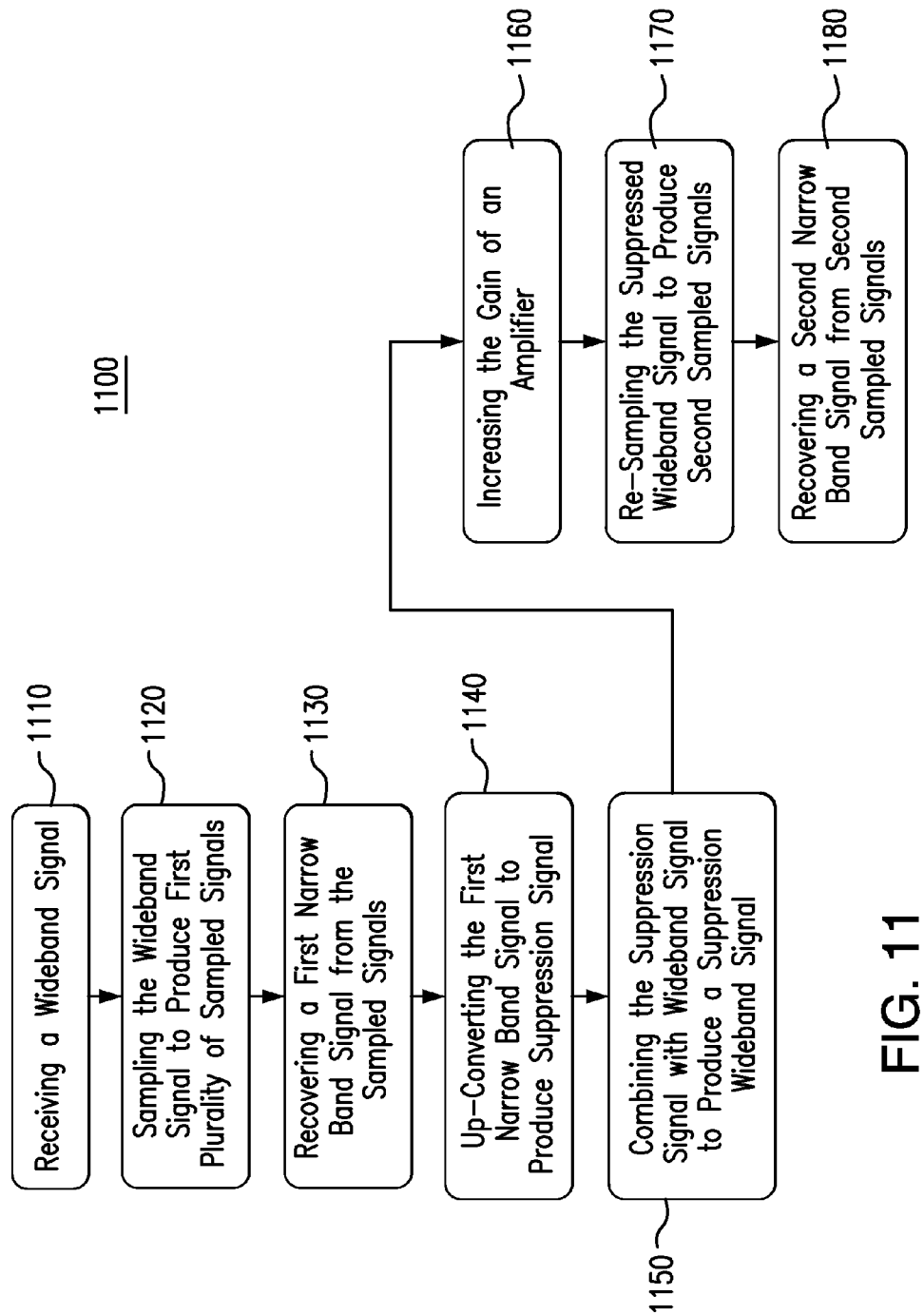
FIG. 11 is a flow chart illustrating a process for iteratively sampling a signal in accordance with exemplary embodiments of the present invention.

Referring to FIG. 11, a flow chart 1100 is provided that illustrates a process for iteratively sampling a wideband signal, including suppressing a narrowband component of the wideband signal by subtracting an up-converted signal from the wideband signal x(t), in accordance with exemplary embodiments of the disclosed devices and methods. In this example, a recovered narrowband signal is up-converted and subtracted from the wideband signal x(t) in order to suppress, or completely eliminate, the component of x(t) corresponding to the recovered narrowband signal in subsequent processing.

In the first step of the process 1110, a wideband signal x(t) is received at a conversion stage 102. The signal may be received, for example, from a base station in a wireless communication network, such as a multi-band cognitive radio.

In step 1120, the wideband signal is sampled by the conversion stage 102 to produce sampled signals $y_m[n]$ using a first set of mixing signals $p_m(t)$, which are received from mixing signal generator 106. The conversion stage 102 is initially configured to have a first gain level for one or more of the amplifiers within the conversion stage 102. In step 1130, the recovery stage 104 recovers a first set of narrowband signals $w_L[n]$ using the sampled signals $y_m[n]$, produced by the conversion stage 102.

Figure 12A:
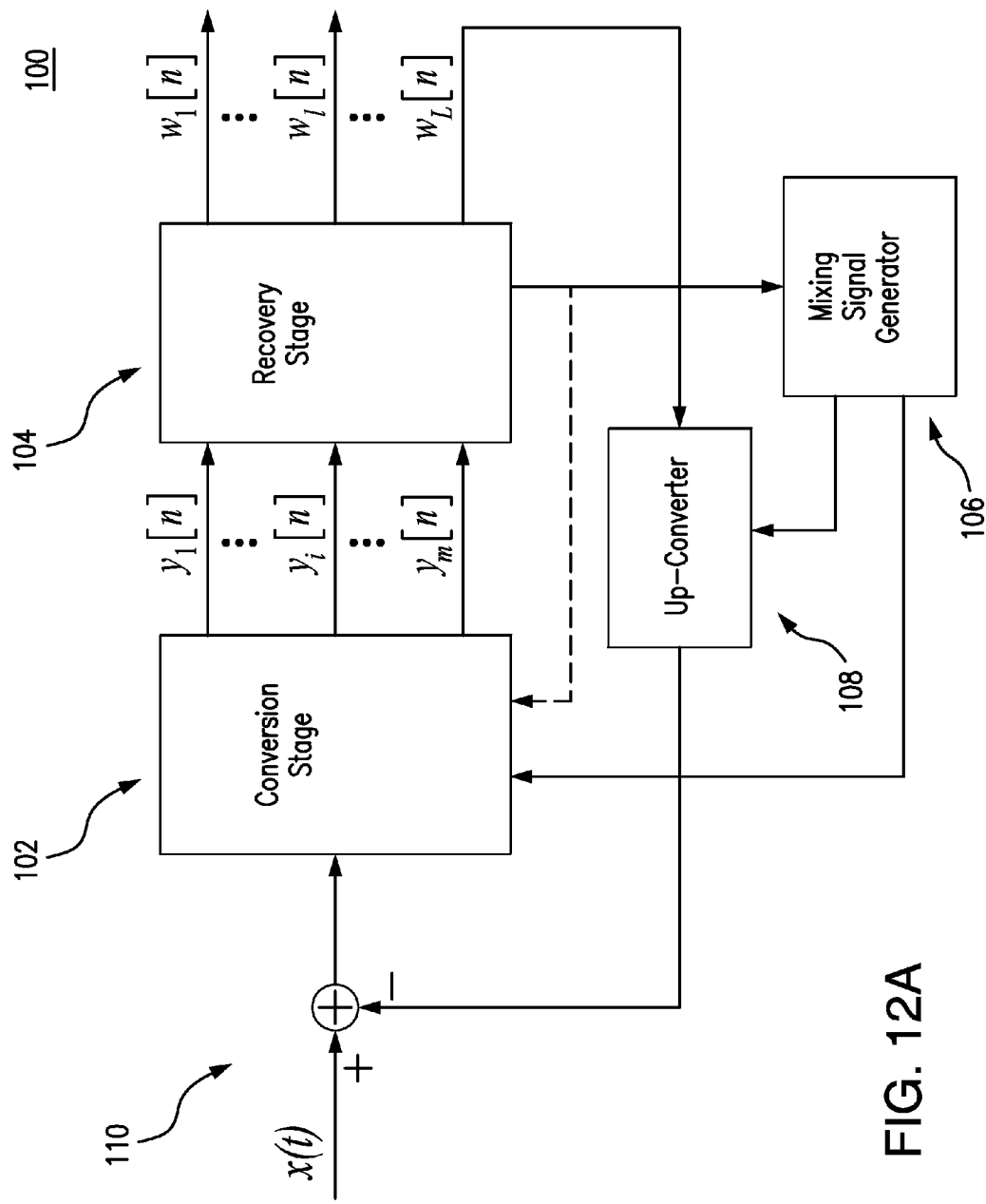
FIG. 12A is a block diagram of a device for iteratively sampling a wideband signal in accordance with exemplary embodiments of the present invention.
Figure 12B:
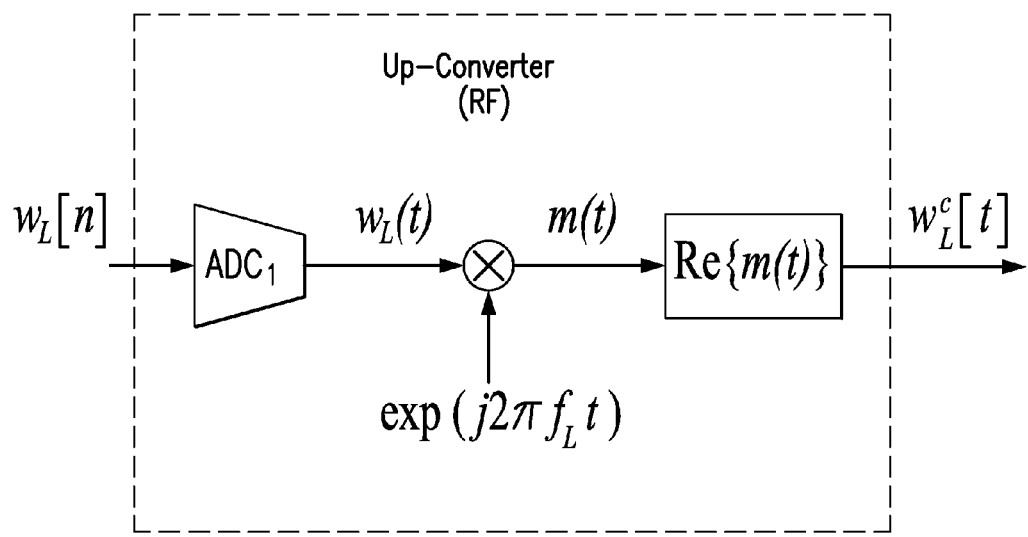
FIG. 12B is a schematic of a circuit for up-converting a recovered signal in accordance with exemplary embodiments of the present invention.

In step 1140, a recovered narrowband signal, such as one of $w_L[n]$, is up-converted to generate a suppression signal. The recovered narrowband signal may be up-converted, for example, by an up-conversion stage 106, as illustrated in FIG. 12B. According to this embodiment, the recovered narrowband signal is converted to an analog signal by a digital-to-analog converter and then mixed with a periodic signal of the form $\exp(j2\pi f_L t)$, where $f_L$ is the center frequency of the recovered narrowband signal. In this example, only the real part of the mixed signal is used for the suppression signal. In a case where the recovery stage 104 produces an analog signal, the digital-to-analog converter would not be necessary.

In step 1150, the suppression signal is combined with the wideband signal to produce a suppressed wideband signal. Effectively, the narrowband recovered component is subtracted from the wideband signal.

In step 1160, the gain of one or more of the amplifiers within the conversion stage is increased to a second gain level. In step 1170, the suppressed wideband signal is re-sampled by the conversion stage 102 in order to produce a second set of sampled signals. During this step, the suppressed wideband signal is sampled using a higher gain level than the previous iteration. However, the ADCs of the conversion stage are not driven into suppression due to the suppression of the recovered component of the wideband signal, which was suppressed in step 1150. In step 1180, the recovery stage 104 recovers a second set of narrowband signals from the second set of sampled signals produced by the conversion stage 102 during re-sampling.

According to certain embodiments of the present invention, the steps shown in FIG. 11 may be accomplished by a device including a conversion stage, a recovery stage, and an up-conversion stage. An exemplary device is provided in FIG. 12A. Sampling and re-sampling are performed by a conversion stage 102, which may comprise a modulated wideband converter as illustrated in FIG. 6. For instance, the conversion stage 102 may comprise a plurality of channels each of which contains a mixer 202, a low-pass filter 204, an amplifier 206, and an ADC 208. In some instances, the periodic signal used in the up-conversion stage 108 may be provided by a mixing signal generator 106.

Figure 13:
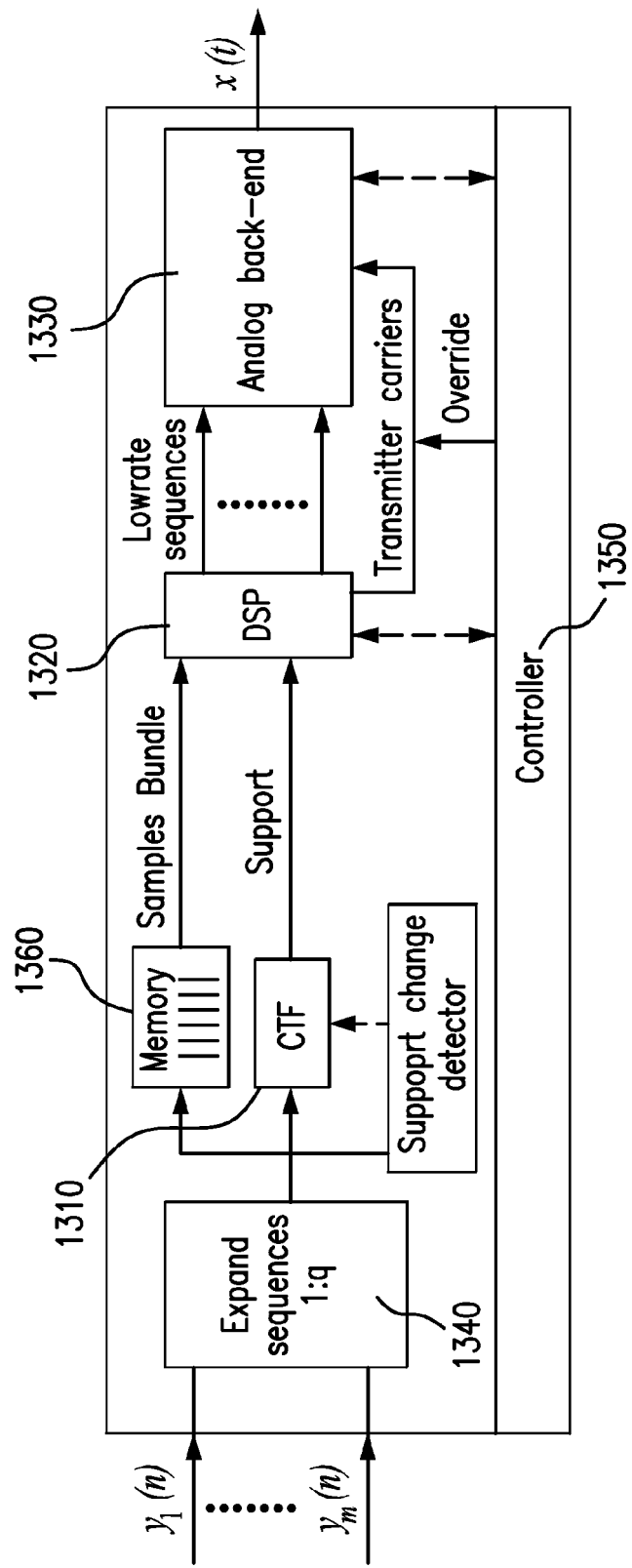
FIG. 13 is a schematic of a recovery circuit in accordance with exemplary embodiments of the present invention.

FIG. 13 shows the high-level architecture of an exemplary recovery stage that may be used for the recovery of narrowband signals based on one or more received sampled signals from a conversion stage 102. The recovery stage 104 may include a first portion that may be used to determine the frequency of strong narrowband signals, such as a continuous to finite (CTF) block 1310. Once the frequency support of the received wideband signal becomes known, a digital signal processing (DSP) block 1320 recovers the narrowband signals, and outputs $w_L[n]$ using the sampled signals $y_m[n]$. In certain embodiments, the recovery stage may further include an analog backend 1330, which outputs an analog, rather than digital, recovered signals.

For example, with reference to FIG. 13, sampled signals may enter the recovery stage and be optionally expanded 1340 by a factor, such as $q=f_s/f_p$. A controller 1350 may trigger the CTF block upon initialization, and additionally, upon an identification that the spectral support of the sampled signal has changed. A spectral change may be detected in a number of ways, including by a high-level application layer or a simpler technique such as monitoring the spectral support against a threshold value. The DSP block 1320 processes the samples based on the recovered support and outputs a low rate sequence for each active spectrum slice, e.g., those with signal energy. A memory unit 1360 stores input samples, for instance, 2N instances of $y_m[n]$, so that upon recognition of a spectral support change, the DSP block 1320 may produce valid outputs in the period required for the CTF 1310 to compute new spectral support. The analog backend 1330 interpolates the sequences from the DSP 1320 and sums them. The controller 1350 may be configured to selectively activate the digital recovery of any specific band of interest, and in particular, to produce an analog counterpart (at baseband) by overriding the relevant carrier frequencies.

According to certain embodiments of the present invention, the recovery stage 104, for instance DSP block 1320, may provide the conversion stage 102 and/or mixing signal generator 106 with appropriate control signals, which are used to determine, for instance, amplifier gain settings and mixing signal parameters.

As is clear from the foregoing descriptions of the exemplary devices and methods in which the present invention may be embodied, different iterations may create multiple replicas of the same narrowband signals. Some narrowband signals may be intentionally recovered at multiple iterations, for example, if they are so weak that their recovery is not as accurate as necessary or fails to meet a predetermined quality metric. According to certain embodiments of the present invention, these different replicas may experience different levels of interference and noise, especially, different levels of ADC noise corresponding to different levels of the amplifier gain. These different replicas may be combined to generate a composite signal, for instance, with combining weights that depend on the respective interference and noise level of a given iteration, so that more accurate replicas contribute more to the recovery and less accurate replicas contribute less.

For example, the narrowband signal $w_4(t)$ may be recovered in all three iterations illustrated in FIG. 7. As a consequence, when the replicas are normalized by the corresponding full scale range, the combining weight for the iteration of FIG. 7(*a*) should be smaller than that for the iteration of FIG. 7(*b*), and the combining weight for the iteration of FIG. 7(*b*) should be smaller than that for the iteration of FIG. 7(*c*). In some respects, normalization by the full scale range is equivalent to normalization by the level of ADC noise. For instance, if a linear combination of multiple replicas of the same narrowband signal is used, the combining weights can be set to be proportional to the signal gains of the normalized replicas. In this case, all the normalized replicas have the same level of ADC noise, which may be an optimal combining scenario when ADC noise is dominant. In contrast, when the interference or the thermal noise is as substantial as ADC noise, the normalization may be done by the level of interference plus noise (both thermal noise and ADC noise).

In the various embodiments described above, the devices and methods may operate across a broad range of frequency ranges. For instance, the sampling technique may be able to recover narrowband signals having a center frequency ranging from a few kHz up to over 20 GHz. Exemplary mixing signal frequencies may be in the range of 10 GHz, with a period of approximately 50 MHz. Additionally, the various suppression techniques provided herein may be able to achieve up to at least 20 dB of suppression. For instance, suppression by altering the mixing signal may result in 5 dB of suppression, while subtraction/cancellation techniques may result in 20 dB of suppression. Greater suppression and/or performance may be achieved by combining the techniques described herein. For example, a wideband signal may be re-sampled with a mixing signal selected to suppress a specific narrowband component, while at the same time, the baseband equivalent is subtracted from the mixed signal to achieve greater suppression.

While various embodiments have been described above, it should be understood that they have been presented by way of example only, and not limitation. Thus, the breadth and scope of the present disclosure should not be limited by any of the above-described exemplary embodiments. Moreover, any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this was done solely for the sake of illustration. Accordingly, it is contemplated that some steps may be added, some steps may be omitted, the order of steps may be re-arranged, and some steps may be performed in parallel.

What is claimed is:

1. A method for iteratively sampling a signal comprising:
receiving a wideband signal;
sampling said received wideband signal using a sampling device having an amplifier set at a first gain level to produce a first plurality of sampled signals;
recovering from said first plurality of sampled signals a first narrow band signal;
re-sampling said received wideband signal using said sampling device to produce a second plurality of sampled signals, wherein said re-sampling includes increasing the gain of said amplifier to a second gain level and suppressing a narrowband component of said wideband signal based on said recovered first narrow band signal; and
recovering from said second plurality of sampled signals a second narrowband signal,
wherein said sampling device further comprises a mixer configured to receive one or more mixing signals, and wherein the re-sampling includes mixing the received wideband signal with said one or more mixing signals using said mixer to produce a mixed signal,
wherein said first narrow band signal has a first center frequency and said sampling device further comprises a second mixer configured to receive one or more periodic mixing signals having a frequency equal to said first center frequency,
wherein the re-sampling includes mixing the received wideband signal with said one or more periodic mixing signals to produce a narrowband suppression signal, and
wherein the suppressing further comprises subtracting said narrow band suppression signal from said mixed signal.

2. The method of claim 1, further comprising:
   determining whether said recovered second narrowband signal or a subsequently recovered narrowband signal satisfies a predetermined signal quality requirement and, if not,
   re-sampling said received wideband signal using said sampling device to produce a subsequently produced plurality of sampled signals, wherein said re-sampling includes increasing the gain of said amplifier to an increased gain level and suppressing a narrowband component of said wideband signal based on said recovered second narrow band signal or subsequently recovered narrowband signal;
   recovering from said subsequently produced plurality of sampled signals a recovered narrowband signal; and
   repeating the determining step.

3. The method of claim 2, wherein said predetermined signal quality requirement is a signal-to-noise ratio.

4. The method of claim 1, further comprising combining said first narrowband signal and said second narrowband signal to produce a composite signal.

5. The method of claim 1, wherein the suppressing further comprises adjusting one or more mixing signals based on said recovered first narrowband signal.

6. The method of claim 1, wherein the suppressing further comprises subtracting a narrow band suppression signal from said mixed signal.

7. The method of claim 6, wherein said suppression signal is a baseband equivalent of said first recovered narrow band signal.

8. The method of claim 1, wherein said one or more periodic mixing signals is a sinusoidal wave.

9. The method of claim 1, wherein said one or more periodic mixing signals is a square wave.

10. The method of claim 1, further comprising:
    re-sampling said received wideband signal using said sampling device to produce a third plurality of sampled signals, wherein said re-sampling includes increasing the gain of said amplifier to a third gain level and suppressing a narrowband component of said wideband signal based on said recovered second narrow band signal;
    recovering from said third plurality of sampled signals a third narrowband signal.

11. The method of claim 10, wherein said sampling device further comprises a mixer configured to receive one or more mixing signals, and wherein the re-sampling includes mixing the received wideband signal with said one or more mixing signals using said mixer to produce a mixed signal.

12. The method of claim 1, further comprising:
    up-converting said first narrow band signal to produce a suppression signal, wherein the suppressing further comprises subtracting said suppression signal from said wideband signal.

13. The method of claim 1, wherein said sampling device includes an analog-to-digital converter and said second gain level is determined based on a performance characteristic of said analog-to-digital converter.

14. A device for iteratively sampling a signal comprising:
    a conversion stage having an amplifier set at a first gain level, wherein said conversion stage is configured to receive a wideband signal and sample said wideband signal to produce a first plurality of sampled signals; and
    a recovery stage configured to receive at least one of said first plurality of sampled signals from said conversion stage and to produce a first narrowband signal,
    wherein said conversion stage is further configured to re-sample said wideband signal to produce a second plurality of sampled signals, wherein said re-sampling includes increasing the gain of said amplifier to a second gain level and suppressing a narrowband component of said wideband signal based on said recovered first narrowband signal, and
    wherein said recovery stage is further configured to receive at least one of said second plurality of sampled signals from said conversion stage and to produce a second narrowband signal,
    wherein said recovery stage is further configured to determine whether said second narrowband signal or a subsequently recovered narrowband signal satisfies a predetermined signal quality requirement, and, if the recovery stage determines that said second narrowband signal or a subsequently recovered narrowband signal does not satisfy said predetermined signal quality requirement, said conversion stage is further configured to re-sample said received wideband signal to produce a subsequently produced plurality of sampled signals,
    wherein said re-sampling includes increasing the gain of said amplifier to an increased gain level and suppressing a narrowband component of said wideband signal based on said recovered second narrow band signal or subsequently recovered narrowband signal, and
    said recovery stage is further configured to recover from said subsequently produced plurality of sampled signals a recovered narrowband signal and repeat the determination of whether said subsequently recovered narrowband signal satisfies a predetermined signal quality requirement.

15. The device of claim 14, wherein said recovery stage is further configured to combine said first narrowband signal and said second narrowband signal to produce a composite signal.

16. The device of claim 14, wherein said conversion stage further comprises a mixer configured to receive one or more mixing signals and said conversion stage is further configured to mix said received wideband signal with said mixing signal to produce a mixed signal.

17. The device of claim 16, wherein said conversion stage further comprises:
    a low-pass filter; and
    an analog-to-digital converter.

18. The device of claim 16, wherein suppressing includes adjusting one or more mixing signals based on said recovered first narrowband signal.

19. The device of claim 16, wherein suppressing includes subtracting a narrow band suppression signal from said mixed signal.

20. The device of claim 19, wherein the narrow band suppression signal is a baseband equivalent of said first recovered narrow band signal.

21. The device of claim 16, wherein said conversion stage is further configured to produce a suppression signal using a periodic wave having a frequency determined based at least in part on said first recovered narrowband signal produced by said recovery stage.

22. The device of claim 21, wherein suppressing includes subtracting said suppression signal from said mixed signal.

23. The device of claim 14, further comprising:
    an up-conversion stage configured to receive said first narrowband signal from said recovery stage and produce a suppression signal,
    wherein suppressing comprises subtracting said suppression signal from said wideband signal.

* * * * *